Feb. 9, 1971 C. E. BENJAMIN 3,561,108

ALTERNATED ORIENTATION OF CHIPS ON SEMICONDUCTOR WAFERS

Filed Aug. 2, 1967

INVENTOR.
CHARLES E. BENJAMIN

BY John F Ohlandt Jr

ATTORNEY 3,561,108

ALTERNATED ORIENTATION OF CHIPS ON SEMICONDUCTOR WAFERS

Charles E. Benjamin, Poughkeepsie, N.Y., assignor to International Business Machines Corporation, Armonk, N.Y., a corporation of New York Filed Aug. 2, 1967, Ser. No. 657,863
Int. Cl. H01l 7/64
U.S. Cl. 29—578 3 Claims

ABSTRACT OF THE DISCLOSURE

A process of fabricating semiconductor devices in which a master slice having a standard device configuration is utilized for obtaining a variety of finished device forms, in which the dimension for the frames of the master slice is designated $a$, and an array of device forms having a dimension of $a(n+\frac{1}{2})$ is to be fabricated, which includes the essential step of fabricating the device forms so that there is 180° rotational symmetry about a center point for successive rows of device forms in said array.

This invention relates generally to semiconductor devices and, more particularly, to an improvement in the technique of forming integrated solid-state circuits.

Immediately following the advent of the transistor, with all of the consequent changes introduced into the semiconductor arts by such a revolutionary development, the search began to find ways to incorporate these active solid-state devices into complex arrangements and to pack such devices into extremely small dimensions. Printed circuit and other techniques have been used in the past in this attempt to obtain reasonably high packing densities in the formation of circuits utilizing semi-conductor devices. Only very recently, however, have the so-called integrated approaches to device fabrication and to the connecting of such devices in various circuit configurations become practicable.

Various approaches to device and circuit fabrication have been lumped under the heading of "Integrated Circuit" techniques. According to one of these methods the devices themselves are produced quite conventionally by sequential diffusion steps involving the diffusion of several desired impurities materials into a semiconductor wafer, followed by the dicing or cutting up of the semiconductor wafer into single or multiple device "chips." These chips are then secured to a circuit board or module and are connected in complex patterns by known printed circuit processes. The passive components such as resistors, required for the circuit operation are, for example, simply provided by the deposition of suitable resistance materials on the modules. Similarly, other desired passive components are formed on the module. Hereinafter, this general approach will be referred to as the "chip" method of integrated circuit manufacture.

The creation of the active devices themselves, that is, the fabrication en masse of tremendous numbers of these tiny devices is usually accomplished by the so-called planar technique. In accordance with this technique, for the production of transistors, the collector and emitter junctions are both defined by diffusion masking on the surface of a semiconductor substrate, the masking being such that both junctions emerge at the surface of the wafer. These junctions are formed by a sequence of masked diffusion steps, in the first step of which the upper surface of a semi-conductor substrate is covered with an oxide coating. In the event that silicon is selected as the semi-conductor material a silicon oxide coating is usually formed by oxidizing the surface of the silicon wafer. Thereafter, by well-known photo-resist techniques, selected areas for the device creation are opened in the oxide coating and a first suitable impurity is diffused through the openings and into the semiconductor substrate, thereby producing desired embedded base regions. Thereafter, in similar fashion, another mask is formed for the emitter diffusion, that is, diffusion of an impurity of opposite conductivity type into the already formed base regions, thereby to obtain embedded emitter regions nested within the base regions.

The planar technique as described above, lends itself well to various forms of integrated circuit manufacture. Having formed the semiconductor devices within the wafer of semiconductor material by means of the controlled diffusion of selected impurities, the oxide mask, which is insulative in character, may be left on the surface of the wafer and appropriate conducting layers in the form of strips or "lands" may be formed over the oxide so as to contact predetermined regions of the embedded devices and to interconnect, as desired, a plurality of such devices. When an entire array of circuit elements, including passive components, as well as the aforenoted active devices, is formed within a block of semiconductor material, the method or approach is termed "monolithic." This monolith approach differs somewhat from the already described chip method.

It will be understood that a variety of methods can be adopted for integrated circuit manufacture, including what are sometimes referred to as "hybrid" approaches, but the emphasis, for the sake of simplicity, is placed on the principal or main approaches in the integrated circuit field.

The present invention, then, is not limited in any way to a single integrated circuit approach. The present invention is concerned, in general, with a method whose aims or objectives are to reduce substantially the costs of integrated circuit manufacture, even though its implementation will be explained in the context of the so-called "chip" method of forming integrated circuits.

By way of a brief background for an understanding of the cost factors involved in the fabrication of integrated circuits, it is well to note that there has been a substantial change in the design philosophy governing circuit manufacture. Rather than the focus of attention being on the individual device parameters, attention has shifted to the possibilities of higher yield for more complicated assemblies wtih attendant reduction in costs. In other words, the design philosophy has tended to become more concerned with the economics of total performance and, correspondingly, decreasing emphasis has been placed on the strict device tolerances previously followed.

As a result of this difference in design philosophy an integrated circuit design would generally call for a far greater number of individual devices for accomplishing a circuit function than would the old-style design. The integrated design would seek to accomplish the objectives with a minimum number of processing steps and with the most reliable kind of processing such that, despite the fact that a much greater number of devices were being employed for the particular circuit function, the yield for the overall design would be much higher and consequently would be achieved with much lowered cost.

Despite what has been said above about the increased numbers of devices in a present day, integrated circuit design when compared with previous old-style approaches, the integrated circuit manufacturer is still interested in reducing costs further. In other words, he is not entirely profligate in his use of devices and he is still striving to pack the maximum number of devices into a given volume.

Accordingly, it is a primary object of the present invention to provide a technique that will permit maximization of the number of devices that can be obtained for a given semiconductor wafer.

Getting down to the specifics of integrated circuit fabrication, it has been known in the so-called chip-type of integrated circuit to provide what is known as a solder ball connection to the devices underneath the original insulative coating. In other words, as described hereinabove, whether one is following a fully integrated approach or the so-called chip approach, the devices themselves are embedded below the surface of a semiconductor wafer. After these devices have been so embedded it is necessary, of course, to connect them to the external world and hence conductive layers are deposited on the insulative oxide coating. Furthermore, since it is desirable to protect the conductive layers, they are covered with a layer of glass or the like. However, connection to the conductive layers is conveniently made through the agency of a solder ball which is fitted in a hole provided in the glass coating. The ball itself projects through the hole so as to make contact with a conductive layer. The details of each arrangement are not being repeated here because they are well-known and, per se, they do not form a part of the present invention.

The precisely located contact holes that are provided for the solder balls are usually realized by a masking pattern produced by the use of a step-and-repeat camera or by the use of a fly's eye camera. The step-and-repeat camera is able to make masks for arrays of any sized chip in any orientation but for some purposes it is not an adequate device. Thus, it is not adequate for mask registration where extremely fine patterns are involved. For this reason the fly's eye camera must be used. This fly's eye camera is a device well-known by now and its essential operation may be understood by reference to U.S. Pat. 3,288,045 in the name of W. H. Harding and assigned to the assignee of the present application.

It is thought helpful at this point to define certain terms that will be used later on in the specification. One of these terms is "master slice" technique. This is a technique whereby the patterns for a number of component regions are produced for each chip area, and at a point later in the process, a custom interconnection pattern is applied to the desired areas to produce the required circuit function. Typically, a number of such interconnection patterns are used for families of similar circuit functions. The purpose, then, behind this is that most of the masks will be generic to as many different product types as possible. In the specific context of the solder ball arrangement referred to hereinabove, this master slice technique enables differentiation into individual types of semiconductor wafers or units, that is, into either three-ball, five-ball or seven-ball chips, which can be completed, as such, as late in the game as possible. In other words, the mask design is such that a number of essential operations can first be performed, these operations being common to a variety of final products.

Accordingly, it is another basic object of the present invention to substantially reduce the engineering effort, the tooling requirements, and the production line difficulties which attend the normal multiple-product manufacturing.

Another object, in line with the above object, is effectively to exploit the master slice technique and adapt it to the fullest to the various products formerly produced by a variety of procedures.

Another object is to make the fly's eye camera technique adaptable to the production of the maximum number of devices per wafer.

The above objects are fulfilled in accordance with the present invention by the basic feature which comprises reversing the orientation of alternate rows of device forms or chips. This is effected, of course, by reversal of the masking operations entailed in creating the finished device forms. In one specific form, a five-ball-interconnection transistor chip arrangement is fabricated in such a manner that a five-ball-interconnection transistor chip in an adjacent row corresponds to a 180° rotation of a first transistor chip, thereby permitting the saving of a significant amount of material in a wafer during the fabrication operation. The key design ground rule is that all device patterns in the basic grid must have 180° rotational symmetry.

The technique of the present invention may best be appreciated by reviewing the state of the art at present. At the present time, semiconductor devices for integrated circuit manufacture are commonly made on wafers such that they all have the same orientation with respect to each other. For example, well-known chip techniques have the collector, or common, solder ball facing "upwards" and have the emitter solder balls to one side, and the solder balls for the base region to the other side of the wafer. Complete integrated circuits are similarly made, with each chip having the same pattern and functional orientation on any given wafer.

As contrasted with the above arrangements, the technique of the present invention starts with a square grid array of identical patterns for as many masking operations as possible. These masks are produced preferably by the fly's eye technology—but not necessarily thereby. The patterns must have 180° rotational symmetry about a center point. While the wafer is being processed with these masks, it is, in effect, a "master slice," since later operations with distinctive masks can complete it into one of several different products, each having its distinct circuit function.

The device forms that are provided in accordance with the present invention require that every other row and/or column of devices be reversed. These device forms are actually chips with length and/or width dimensions of $(n+\frac{1}{2})$ times the original grid pitch, where $n$ is an integer. By grid pitch is simply meant the distance from a given point in a chip to the corresponding point in an adjacent chip. Masks for such processes can be made on the fly's eye camera using multiple stop-plate techniques. This infers that the pattern for one chip is taken by more than one lens, and that in certain cases the pattern taken by one lens belongs to more than one chip.

The advantages of the technique of the present invention will thus be clearly appreciated. The technique, in effect, extends the master slice approach; that is, it allows this approach to us used with maximum effectiveness in producing device forms which have length and/or width dimensions of both $m$ and $(n+\frac{1}{2})$ times the minimum grid pitch ($m$ and $n$ are both integers not necessarily the same). Several production examples have already been realized by following this technique. Thus, it is possible to formulate a single master slice from which there can be made 32 by 32, 48 by 32 and 64 by 32 mil chips, each with a different function. Of course, it should be noted that the dimensions referred to here are before dicing.

It should also be emphasized in this brief description of the present invention that it will be understood that a step-and-repeat camera could make masks for arrays of any sized chip in any orientatiton. However, as noted before, resort is preferably had to the fly's eye camera in the case of interest here, namely, the case of obtaining mask registration with extremely fine patterns. But, since the fly's eye camera gives good definition only in the center of the field for each lens the chip size, or rather, the pattern for the holes that are to be provided for each chip, is restricted in size. Therefore, in order to generate chip patterns involving five-solder balls, the solution presented by the present invention is highly advantageous. In other words, by going to a scheme having alternately-oriented rows of chips, a great saving in materials is effected and the fly's eye camera is most effectively applied to the making of five-ball chip patterns.

The technique of the present invention thus obviates the need to wait for new step-and-repeat masks for each progressive modification in mask design as such a development continues. Therefore, unnecessary delays are avoided.

The fundamental advantages of this unique extension of the master slice approach, made possible by the technique of the instant invention, are such as to greatly reduce the confusion and equipment requirements normally associated with the fabrication of many device types in a production line. Scheduling is therefore smoother, and greater standardization is also achieved.

The foregoing and other objects, features and advantages of the invention will be apparent from the following more particular description of preferred embodiments of the invention, as illustrated in the accompanying drawings.

FIG. 2*a* shows a three hole patterns, FIG. 2*b* a five hole pattern and FIG. 2*c* a seven hole pattern.

FIG. 3*a* showing the "master slice" section, which is similar in form to the section shown in FIG. 1, FIG. 3*b* showing the layout for the five hole patterns according to the prior art, and FIG. 3*c* showing the 18° alternate row orientation, according to the present invention.

Figure 1:
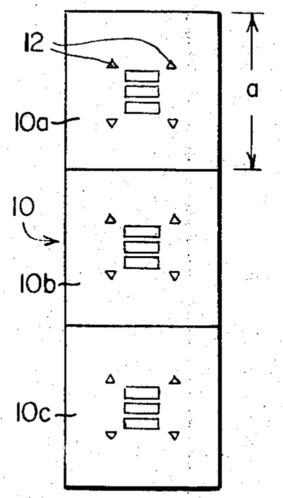
FIG. 1 is a top view of a section of a "master slice," illustrating a standard configuration for the active regions of a plurality of embedded semiconductor devices

Referring now to FIG. 1, there is illustrated a series of unit squares 10*a*, 10*b* and 10*c* of a section 10 of a semiconductor wafer "master slice." Such a slice, as described previously, is used for the purposes of standardization so that only at a late stage in the fabrication method, is it necessary that the particular distinctive patterns for the desired end product be formed. The section 10 depicted in FIG. 1 is part of a much larger square grid array of identical patterns.

For the sake of simplicity, the embedded base and emitter regions of the three transistors 1, 2 and 3, shown within the "frame" or square 10*a*, have been represented simply as rectangles, it being understood that there are actually two embedded regions. The diamond-shaped symbols 12 represent the usual points at which the common contact for the collector is made to the wafer surface through the conventional oxide coating that is used as a mask.

Figure 2:
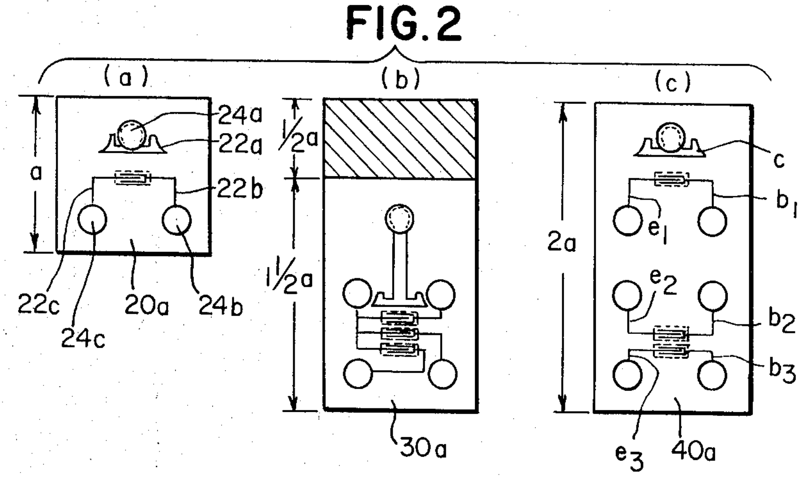
FIG. 2 is an illustration of the underlying conductive pattern and the overlying pattern for the solder-ball-contact holes, where

FIG. 2 shows the application of the "master slice" to a number of different device forms, that is, to either a device form or "chip" which involves three solder-ball contacts, as shown in 2*a*; or a five-ball arrangement, as shown in FIG. 2b; or to a seven-ball arrangement as shown in 2*c*.

Some background may be helpful in appreciating the advantageous application of a master slice in this manner. The usual thing in the fabrication process for the chip form of integrated circuitry, as well as for other forms, is to open up selected areas in the initial insulative coating. In other words, after the active regions have been formed, openings are made in what is usually an oxide coating in order to reach, and make selective contact to, these active device regions. It is then customary to form the required conductors by depositing a metal such as aluminum, over the oxide coating so as to cover it completely. Then, by a subtractive etch technique, the unwanted metal is removed, leaving only the restrictive pattern of the "land," as shown, for example, on the chip 20*a* in FIG. 2*a*. The conductor land 22*a* is provided for the collector region and the lands 22*b* and 22*c* are provided for the base and emitter, respectively.

As will be understood, the conductor land 22*a* extends from the typical points 12, at which the ends of the land make contact to the bulk constituting the collector region, to the point underlying the hole 24*a* formed in an overlying glass coating. The hole 24*a* is adapted to receive a solder ball employed for the purpose of making external contact for circuit connecting purposes.

In similar fashion the other conductor lands, 22*b* and 22*c*, extend from their points of contact with their respective active regions to similar holes 24*b* and 24*c*.

The device form or chip in FIG. 2*a* is, as indicated before, identical with a unit square and has the same side dimension *a*. In this example, only one device is being used, that is, the central transistor 2 to whose base and emitter regions, conductor lands 22*b* and 22*c* are connected. In effect, then, of the three devices formed in the master slice square, that is, transistors 1, 2 and 3, in the unit square 10*a* of FIG. 1, only the transistor 2 is "live" in this instance, and the other two transistors have simply been covered up and are not being used.

In contrast with FIG. 2*a*, the arrangement depicted in FIG. 2*b* involves five-solder balls, and the device form or chip 30*a* extends over a greater area than a unit square. In fact, it is half again as long as the device chip 20*a*. Thus, device chip 30*a* is exemplary of the device forms contemplated by the present invention, that is, device forms or chips in which the length dimension is $(n-½)$ times the original grid dimension, where $n$ is an integer. In this particular case, of course, the length is 1½ times the unit length *a*. It must be emphasized here that $n$ may be any integer and need not be "one." The "master slice," or rather the section 10 thereof, is, of course, also amenable to being formed into the chip 40*a* of FIG. 2*c*, which entails a seven-solder ball arrangement. The conductor lands appropriate to this arrangement have also been indicated in FIG. 2*c*. The particular land configuration or conductive pattern is simply a typical one and has been shown for the case of a 3 transistor chip, which entails 3 emitter connections, 3 base connections and 1 collector connection.

Figure 3:
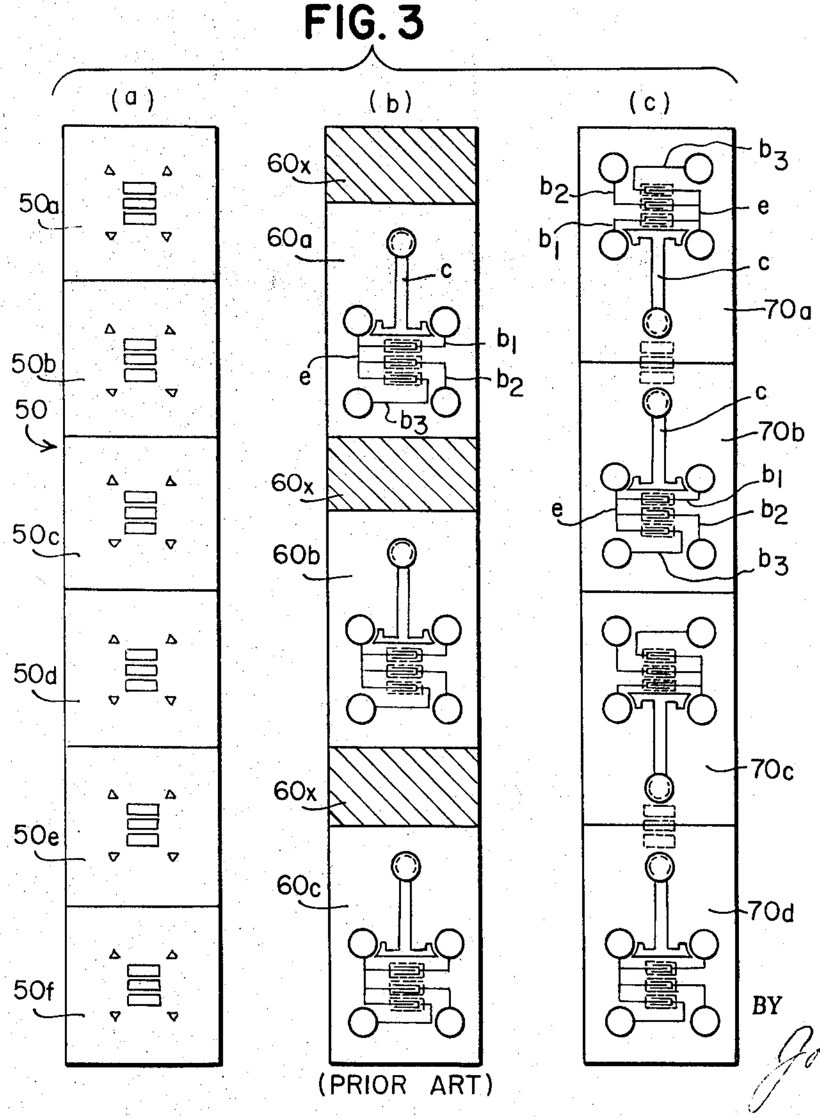
FIG. 3 illustrates the application of a "master slice" using a five hole pattern.

Referring now to FIG. 3, a layout is depicted which will make abundantly clear the fundamental advantages of the present invention. More particularly, the saving in wafer space that is enabled by the technique of the present invention will be readily comprehended.

For puposes of comparison, the section of a "master slice" designated 50, which is shown in FIG. 3*a* is the same as the version shown in FIG. 1, except that it has been extended so as to include a series of 6 unit squares, i.e., 50*a*, 50*b*, 50*c*, 50*d*, 50*e* and 50*f*.

FIG. 3*b* shows the effect of the subsequent treatment of the "master slice" 50 in forming five solder ball chips, one of which, 60*a* has been shown as including its appropriate conductor lands.

Because of the fact that the solder-ball spacing, in effect, determines the chip size, it is a necessary consequence that if the conventional or prior art method of repeating the five-ball pattern is followed, then there will be the waste of space, as shown by the hatched lines in FIG. 3*b*. This wastage is designated 60*x*.

In other words, regardless of the specific number of devices within a given chip 60*a*, there is this great wastage. Thus, it matters not whether, for example, a 2 transistor chip is being fabricated having 2 emitter connections, 2 base connections and 1 collector connection, or, as in the precise example of FIG. 3*b*, a 3 transistor chip is formed with the three emitters connected in common as designated by the letter *c* in 60*a*, and with 3 base connections designated *b*1, *b*2, *b*3 and 1 collector connection, *c*. In either case, the fact remains that it is possible, in this prior art manner, to realize only the three chips 60*a*, 60*b* and 60*c* corresponding to the 6-unit squares in FIG. 3*a*.

On the other hand, with the particular layout shown in FIG. 3*c*, which is a layout in accordance with the present invention, four chips, i.e. chips 70*a*, 70*b*, 70*c* and 70*d*, having the same or similar characteristics as chips 60*a*, 60*b*, 60*c*, can be realized in the same section of the master slice 50. By this technique of alternated orientation, or more precisely stated, 180° rotation of every other row in an array—rather than having all rows with the same orientation a large saving of wafer space, amounting to 25% is effected.

It should be pointed out that, for the sake of simplicity in making the comparison, only a single column or section of a much larger slice has been depicted in FIG. 3. However, what is typically being provided is an alternated orientation of entire rows of chips, like chip 70*a*.

It should also be noted that, for the sake of clarity and to focus attention on the salient differences between the prior art and the technique of the present invention, the detailed set of operations in arriving at the final device form or chip configuration as shown in FIG. 3*c*, has not been described. These operations, including the various masking and photo-resist techniques, are, per se, well-known. Moreover, it is believed that with the background that has already been provided, one skilled in the art will appreciate the broadly-described technique of the invention in its essentials. It does not particularly matter how the alternation or reversal of the chip rows is accomplished. This can be done in a number of ways, and it is immaterial how the masking patterns are developed, that is to say, whether they are done on an individual basis or in composite arrangements.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. In a process of fabricating semiconductor devices comprising the steps of:

providing a master slice semiconductor wafer comprising a repetitive grid configuration of unit squares, each square having formed therein a group of identically located embedded device regions, the dimensions for each unit square being $a$;

forming an array of chips, each of which has a longitudinal dimension, $a(n+1/2)$, each chip including integral conductor lands connected only to predetermined ones in at least one group of said embedded device regions and with other ones of said device regions being left unconnected;

the improvement which comprises forming said array of chips by a sequence of masking patterns which produce successive alternation of rows of said chips in said array between two orientations which have 180° rotational symmetry with respect to each other, thereby to maximize the total number of groups of device regions to which said lands are connected in a given column of said array and thus minimize the wastage of space in said wafer.

2. A process as defined in claim 1, in which $n$ is 1.

3. A process as defined in claim 1, in which said step of forming said array of chips includes forming solder ball contacts to each of the integral conductor lands connected to said embedded device regions.

References Cited

UNITED STATES PATENTS 3,383,614 5/1968 Emmons et al. ------ 317—235

JERRY D. CRAIG, Primary Examiner

U.S. Cl. X.R.

29—591; 317—235

UNITED STATES PATENT OFFICE
CERTIFICATE OF CORRECTION

Patent No. 3,561,108 Dated February 9, 1971

Inventor(s) Charles E. Benjamin

It is certified that error appears in the above-identified patent and that said Letters Patent are hereby corrected as shown below:

Column 2, line 24, change "monolith" to -- monolithic --

Column 5, line 28, "18°" should be -- 180° --.

Column 6, line 29, delete "of course".

Signed and sealed this 18th day of May 1971.

(SEAL)
Attest:

EDWARD M.FLETCHER,JR.
Attesting Officer

WILLIAM E. SCHUYLER, JR.
Commissioner of Patents